United States Patent
Buisson et al.

(10) Patent No.: US 10,093,141 B2
(45) Date of Patent: Oct. 9, 2018

(54) METHOD FOR SIMULATING A DEFLECTION RADIUS OF A MOTOR VEHICLE TIRE

(71) Applicants: COMPAGNIE GENERALE DES ETABLISSEMENTS MICHELIN, Clermont-Ferrand (FR); Michelin Recherche et Technique S.A., Granges-Paccot (CH)

(72) Inventors: Jérémy Buisson, Clermont-Ferrand (FR); Teddy Virin, Clermont-Ferrand (FR)

(73) Assignee: Compagnie Generale des Etablissements Michelin, Clermont-Ferrand (FR)

( * ) Notice: Subject to any disclaimer, the term of this patent is extended or adjusted under 35 U.S.C. 154(b) by 282 days.

(21) Appl. No.: 14/909,525

(22) PCT Filed: Jul. 23, 2014

(86) PCT No.: PCT/FR2014/051909
§ 371 (c)(1),
(2) Date: Feb. 2, 2016

(87) PCT Pub. No.: WO2015/015093
PCT Pub. Date: Feb. 5, 2015

(65) Prior Publication Data
US 2016/0185168 A1 Jun. 30, 2016

(30) Foreign Application Priority Data
Aug. 2, 2013 (FR) ...................... 13 57695

(51) Int. Cl.
*G06F 17/50* (2006.01)
*B60C 99/00* (2006.01)
*G06F 17/11* (2006.01)

(52) U.S. Cl.
CPC ............ *B60C 99/006* (2013.01); *G06F 17/11* (2013.01); *G06F 17/5009* (2013.01); *G06F 17/5095* (2013.01); *Y02T 10/82* (2013.01)

(58) Field of Classification Search
USPC ............. 703/2, 6; 73/146; 702/140; 340/442
See application file for complete search history.

(56) References Cited

U.S. PATENT DOCUMENTS 6,199,026 B1 * 3/2001 Shiraishi ................... B60C 3/04
702/140
6,763,288 B2 * 7/2004 Caretta ................. B60C 23/066
340/442

(Continued)

FOREIGN PATENT DOCUMENTS

JP 2004-161210 A 6/2004
JP 2005-028912 A 2/2005

(Continued)

OTHER PUBLICATIONS

B. Durand-Gasselin et al., "Assessing the thermo-mechanical TaMeTirE model in offline vehicle simulation and driving simulator tests," Vehicle System Dynamics: International Journal of Vehicle Mechanics and Mobility, vol. 48, Supplement, pp. 211-229 (2010).

(Continued)

*Primary Examiner* — Thai Phan
(74) *Attorney, Agent, or Firm* — Fitzpatrick, Cella, Harper & Scinto

(57) ABSTRACT

A method for producing a tire for a motor vehicle includes estimating a laden radius $R_l$ of the tire using a formula having a form of:

$$R_l = R_0 - \frac{Fz}{K_{ZZ}} + R_V \times V^2 - \left(\frac{R_{Y1}}{Pg} + R_{Y2}\right) \times |Fy| + R_\gamma \times |\gamma|,$$

where $K_{ZZ}$ has a form of: $K_{ZZ} = K_{ZZ\ 0} + K_{ZZp} \times Pg$.

11 Claims, 2 Drawing Sheets

(56) References Cited

U.S. PATENT DOCUMENTS

| | | | |
|---|---|---|---|
| 7,657,353 B2 | 2/2010 | Yasui et al. | 701/28 |
| 8,887,562 B2 * | 11/2014 | Kidney | G01M 17/02 73/146 |
| 2009/0012763 A1 * | 1/2009 | Langer | G01M 17/022 703/8 |
| 2013/0205884 A1 * | 8/2013 | Kidney | G01M 17/02 73/146 |
| 2015/0143913 A1 * | 5/2015 | Adams | G01N 33/227 73/655 |
| 2016/0167467 A1 * | 6/2016 | Buisson | G06F 17/5009 703/2 |

FOREIGN PATENT DOCUMENTS

| | | |
|---|---|---|
| JP | 2006-018454 A | 1/2006 |
| JP | 2006-298209 A | 11/2006 |
| JP | 2011-116151 A | 6/2011 |

OTHER PUBLICATIONS

L. Merkz, "Overturning moment analysis using the Flat plant tyre tester," retrieved from the Internet at URL: http://alexandra.tue.nl/repository/books/625826.pdf, pp. 1-45 (2004).

K. Guo et al., "UniTire: unified tire model for vehicle dynamic simulation," Vehicle System Dynamics: International Journal of Vehicle Mechanics and Mobility, vol. 45, Supplement, pp. 79-99 (2007).

D. Lu et al., "Modelling of tire overturning moment and loaded radius," Vehicle System Dynamics: International Journal of Vehicle Mechanics and Mobility, vol. 44, Supplement, pp. 104-114 (2006).

X.-P. Lu et al., "Effect of tire camber on vehicle dynamic simulation for extreme cornering," Vehicle System Dynamics: International Journal of Vehicle Mechanics and Mobility, vol. 44, Supplement, pp. 39-49 (2006).

W. Liqiang et al., "Research of Tire Rolling Radius Based on the Finite Vibration Unit Model," IOSR Journal of Engineering, vol. 3, No. 4, pp. 49-53 (2013).

Z.-X. Yu et al., "A Simple Analysis Method for Contact Deformation of Rolling Tire," Vehicle System Dynamics: International Journal of Vehicle Mechanics and Mobility, vol. 36, No. 6, pp. 435-443 (2001).

J. Buisson, U.S. Appl. No. 14/909,500, filed Jul. 23, 2014.

J. Buisson, U.S. Appl. No. 14/909,517, filed Jul. 23, 2014.

International Search Report dated Oct. 7, 2014, issued by WIPO in connection with International Application No. PCT/FR2014/051909.

* cited by examiner

METHOD FOR SIMULATING A DEFLECTION RADIUS OF A MOTOR VEHICLE TIRE

FIELD OF THE INVENTION

The invention relates to methods for determining the laden radius of a tire.

RELATED ART

During rolling, under conditions that are typical of those met on a vehicle likely to be equipped with a given tire, the conditions cover a wide range of uses, from rolling in a straight line to rolling at high speed on a circuit.

The road holding behaviour of the vehicles makes use of complex phenomena, in particular at the tires. Taking these phenomena into account in order to understand, analyse and simulate the behaviour is essential in order to improve it. To this end, simulation tools require models that describe the contribution of the tires. Various quantities associated with the tire torsor or its rolling geometry are used; this is the case for the laden radius. This is thus particularly important for assessing the overturning limits of a vehicle, possible contact of the rim with the roadway, the attitude of the vehicle and its height in relation to its aerodynamics.

Various formulations have already been proposed to assess the change in the laden radius of a tire. Among said formulations, different versions of the formulations known as "magic formulas" of H.B. Pacejka can be cited, the most widespread version being MF-5.2 or the final variant MF-6.1. The formulation MF-5.2 that is currently most used describes the laden radius as follows:

$$R_l = R_0 - \frac{Fz}{Kzz},$$

supplemented by an effect linked to the speed in variation of the radius on the load.

The formulation MF-6.1 adds thereto effects due to the pressure, forces and speed according to a formulation that is different from the one invented since it is based on the dual description of the vertical load.

A model for knowing the spacing between a rim and the ground in order to predict the risk of overturning due to contact between the rim and the ground has also been proposed. This model is based on a loaded radius model:

$$R_L = (k_{0_0} + k_{0_V} \cdot V + k_{0_P} \cdot P) + |\gamma| \cdot k_\gamma + F_Z \cdot (k_{Z_0} + k_{Z_V} \cdot V + k_{Z_P} \cdot P) + |F_Y| \cdot (k_{Y_0} + k_{Y_V} \cdot V + k_{Y_P} \cdot P)$$

BRIEF DESCRIPTION OF EMBODIMENTS OF THE INVENTION

The aim of the invention is to propose a method for estimating the loaded radius of the tire, which has greater acuity and is easier to implement.

This aim is achieved according to the invention by virtue of a method for producing a motor vehicle tire, characterized in that it comprises a step of estimating a laden radius $R_l$ of the tire by using a formula of the form:

$$R_l = R_0 - \frac{Fz}{Kzz} + R_V \times V^2 - \left(\frac{R_{Y1}}{Pg} + R_{Y2}\right) \times |Fy| + R_\gamma \times |\gamma|,$$

where $K_{ZZ}$ is written in the form $K_{ZZ} = K_{ZZ\,0} + K_{ZZp} \times Pg$, $K_{ZZ0}$ and $K_{ZZp}$ being numerical values, where Pg is the inflation pressure of the tire, V is the speed of the vehicle, $F_Z$ is the load applied to the tire, $F_Y$ is the transverse thrust force exerted on the tire, $\gamma$ is the camber angle of the vehicle, $R_0$ is a free radius value of the tire at rest, $R_V$ is a coefficient of influence of the speed of the vehicle on the laden radius, $R_{Y1}$ is a coefficient of influence of an inflation pressure on the laden radius via a transverse load value, $R_{Y2}$ is a coefficient of influence of the transverse load on the laden radius without the part of the transverse load associated with the pressure, $R_\gamma$ is a coefficient of influence of a camber angle value of the vehicle on the laden radius.

Advantageously, the coefficients $R_0$, $R_V$, $R_{Y1}$, $R_{Y2}$, $R_\gamma$ are defined by physical tests on a tire representative of the tire to be designed.

Advantageously, the physical tests are carried out with the aid of a roller of the flat ground type.

Advantageously, the method includes the step of using the TameTire software.

Advantageously, the method comprises the step of using the coefficients $R_0$, $R_V$, $R_{Y1}$, $R_{Y2}$, $R_\gamma$ in the TameTire software.

Advantageously, the transverse thrust force is determined by simulation with the aid of a simulation computer processing tool by inputting a plurality of physical parameters that are indicative of physical stresses to which the tire is subjected into the simulation computer processing tool.

Advantageously, the transverse thrust force ($F_\gamma$) is determined taking an internal temperature and a surface temperature of the tire into account.

Advantageously, the simulation computer processing tool is a processor controlled by the TameTire software.

The invention also relates to a processor for calculating the behaviour of a motor vehicle tire, said processor being configured to estimate a laden radius $R_l$ of the tire, characterized in that it is configured to determine the laden radius $R_l$ by using a formula of the form:

$$R_l = R_0 - \frac{Fz}{Kzz} + R_V \times V^2 - \left(\frac{R_{Y1}}{Pg} + R_{Y2}\right) \times |Fy| + R_\gamma \times |\gamma|,$$

where $K_{ZZ}$ is written in the form $K_{ZZ} = K_{ZZ\,0} + K_{ZZp} \times Pg$, $K_{ZZ0}$ and $K_{ZZp}$ being numerical values, where Pg is the inflation pressure of the tire, V is the speed of the vehicle, $F_Z$ is the load applied to the tire, $F_Y$ is the transverse thrust force exerted on the tire, $\gamma$ is the camber angle of the vehicle, $R_0$ is a free radius value of the tire at rest, $R_V$ is a coefficient of influence of the speed of the vehicle on the laden radius, $R_{Y1}$ is a coefficient of influence of an inflation pressure on the laden radius via a transverse load value, $R_{Y2}$ is a coefficient of influence of the transverse load on the laden radius without the part of the transverse load associated with the pressure, $R_\gamma$ is a coefficient of influence of a camber angle value of the vehicle on the laden radius.

The invention also relates to a motor vehicle tire, characterized in that it is produced by using a simulation of the laden tire $R_l$ of the tire by way of a formula of the form:

$$R_l = R_0 - \frac{Fz}{Kzz} + R_V \times V^2 - \left(\frac{R_{Y1}}{Pg} + R_{Y2}\right) \times |Fy| + R_\gamma \times |\gamma|,$$

where $K_{ZZ}$ is written in the form $K_{ZZ} = K_{ZZ\,0} + K_{ZZp} \times Pg$, $K_{ZZ0}$ and $K_{ZZp}$ being numerical values, where Pg is the inflation pressure of the tire, V is the speed of the vehicle, $F_Z$ is the load applied to the tire, $F_Y$ is the transverse thrust force exerted on the tire, $\gamma$ is the camber angle of the vehicle, $R_0$ is a free radius value of the tire at rest, $R_V$ is a coefficient of influence of the speed of the vehicle on the laden radius, $R_{Y1}$ is a coefficient of influence of an inflation pressure on the laden radius via a transverse load value, $R_{Y2}$ is a coefficient of influence of the transverse load on the laden radius without the part of the transverse load associated with the pressure, $R_\gamma$ is a coefficient of influence of a camber angle value of the vehicle on the laden radius.

BRIEF DESCRIPTION OF THE DRAWINGS

Further features, aims and advantages of the invention will become apparent from reading the following description which is given with reference to the appended figures, in which.

DETAILED DESCRIPTION OF EMBODIMENTS OF THE INVENTION

The laden radius of a tire $R_l(m)$ proves to be dependent on a large number of factors, which include the load applied $F_Z(N)$, the vertical stiffness of the tire $K_{ZZ}(Nm^-)$ with its pneumatic component $K_{ZZp}(Nm^{-1})$ and structural component $K_{ZZ\,0}(Nm^{-1})$, the rolling speed $V(ms^{-1})$, the inflation pressure Pg(bar), the transverse thrust force exerted $F_Y(N)$, and the camber angle $\gamma(°)$. All of these quantities should therefore preferably be known, for example measured, or imposed by a simulation tool, in order to find the laden radius of the tire by way of a mathematical formulation. Therefore, the contributions of these various factors will be identified in order then to be able to use said formulation.

In order to assess these phenomena, the following formulation is used here:

$$R_l = R_0 - \frac{F_Z}{K_{ZZ}} + R_V \times V^2 - \left(\frac{R_{Y1}}{Pg} + R_{Y2}\right) \times |F_Y| + R_\gamma \times |\gamma|$$

with $K_{ZZ} = K_{ZZ\,0} + K_{ZZp} \times Pg$ where $K_{ZZ0}$ and $K_{ZZp}$ are preferably fixed coefficients and where the coefficients described in the following are introduced. $R_0(m)$ represents the dimensions of the tire at rest. In this case, this is its free radius. $R_V$ is the coefficient of influence of the speed, in this case squared, on the laden radius. $R_{Y1}$ is the coefficient of influence of the inflation pressure on the laden radius via the transverse load. $R_{Y2}$ is the coefficient of influence of the transverse load on the laden radius, without the part associated with the pressure. $R_\gamma$ is the coefficient of influence of the camber on the laden radius.

The strategy of identifying or obtaining the coefficients $R_0(m), \ldots, R_\gamma$ listed in the preceding paragraph is based on the one hand on the knowledge of the quantities $F_Z(N), \ldots, \gamma(°)$ listed in the paragraph before that. It is based on the other hand on the creation of an experimental design or measurement animation covering a wide range for each of these quantities, in a generally realistic envelope with respect to the use of the tire. Finally, it is based on the optimization of the set of coefficients by virtue of an appropriate algorithm. Starting from an animation produced on an appropriate measuring machine, for example a roller of the flat ground type, the knowledge of the responses of the laden radius of the tire as a function of the selected quantities is found.

Figure 1:
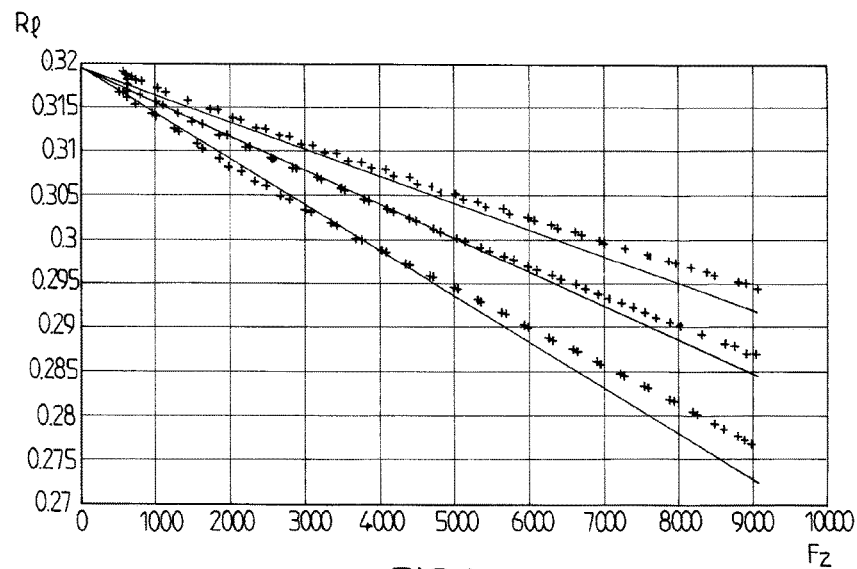
FIG. 1 shows the change in the laden radius as a function of load, for a tire according to the invention.
Figure 2:
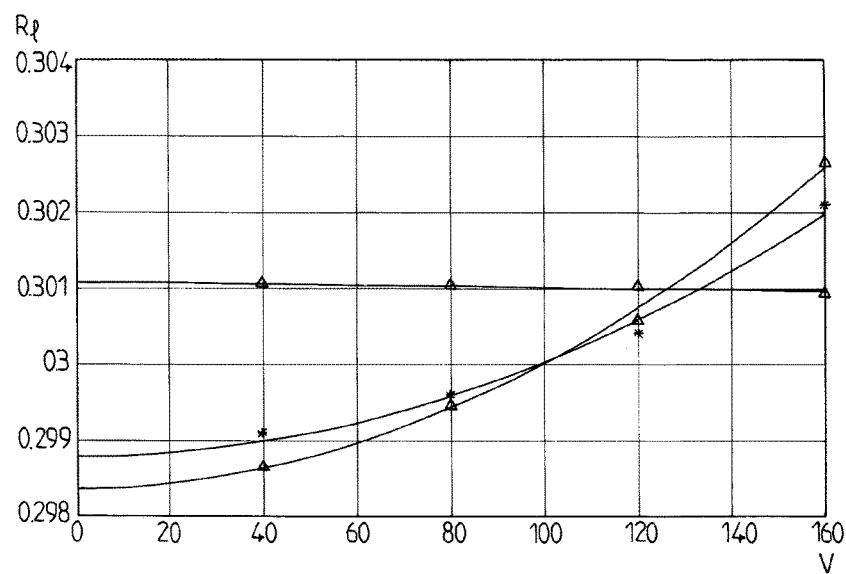
FIG. 2 shows the change in the laden radius as a function of speed, for a tire according to the invention.
Figure 3:
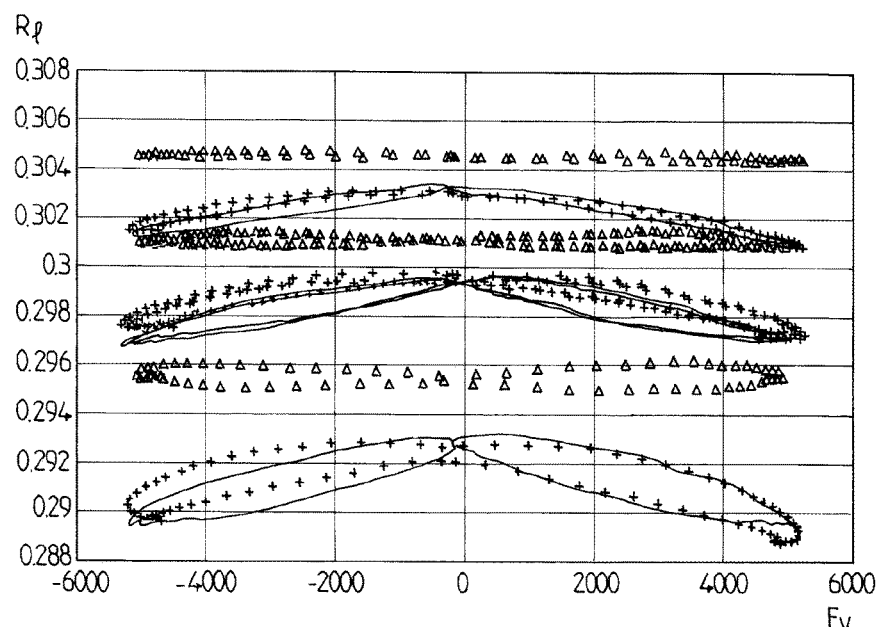
FIG. 3 shows the change in the laden radius as a function of transverse thrust force, for a tire according to the invention.

Since the free radius is the value of the laden radius that is obtained at zero load, it is found by extrapolating the measurement of the radius during simple rolling, that is to say without cornering angles, without camber or curvature, or engine or braking torque, at different loads down to a value of zero load, as illustrated in FIG. 1. In FIG. 1, the solid line plots are simulations at different pressures with the formula set out above, and the dashed, dotted and crossed plots are simulations with the formula MF 5.2. The data in FIG. 1 also make it possible to find the load effect. The effect of the pressure on the dependence of the laden radius on the load, by way of the vertical rigidity of the tire, can be seen in parallel. It can also be seen that the laden radius varies in proportion to the square of the speed, as illustrated in FIG. 2. In FIG. 2, the curved plots are obtained by the proposed model and by measurement, and the substantially horizontal plot is obtained by the MF 5.2 model. The laden radius also varies with the transverse thrust force, as illustrated in FIG. 3. In FIG. 3, it can be seen that this effect is also influenced by the inflation pressure. In FIG. 3, the solid lines represent the results obtained with the proposed model, the crosses correspond to the measurements, and the triangles correspond to the simulations with the model MF 5.2.

Figure 4:
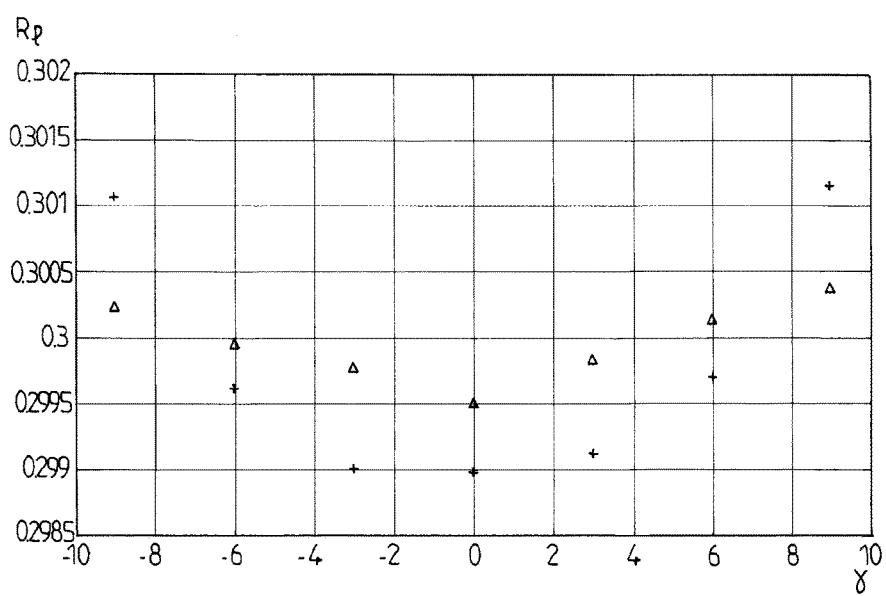
FIG. 4 shows the change in the laden radius as a function of the camber angle, for a tire according to the invention.

The laden radius also varies with the camber angle, as illustrated in FIG. 4. In FIG. 4, the triangles correspond to the simulations carried out with the proposed model, and the crosses are the results of the measurements.

The above observations are then integrated into a strategy for obtaining the coefficients of the laden radius model. A strategy for obtaining the coefficients of the transverse load model is also created. These strategies comprise various steps which can be repeated iteratively in order to improve the correspondence between the model and the reference measurement. The laden radius model and transverse load model are integrated into an overall TameTire model that makes it possible to take the reciprocal interactions of one with the other into account.

The TameTire model is a thermomechanical model developed to improve the prediction of the forces at the wheel centre for studies of the behaviour of the vehicle. The main motivation comes from the observation that mathematical models of the Magic Formula type do not take into account the effects of temperature and speed which are significant for tire forces. In particular, these models are only valid, a priori, in the field of measurement in which they are applicable and do not allow reliable extrapolations when a simulation of different manoeuvres of the vehicle is desired. The TaMeTirE model calculates the longitudinal and lateral forces as a function of physical quantities of the tire such as the size of the area of contact, rigidity of the sidewalls, of the crown block, of the tread, properties of the rubber and friction characteristics. The characteristics of the combination of modulus and coefficient of grip are associated with the temperatures of the tire.

The transverse load is calculated here from the TameTire model instead of being imposed so as to follow a given path as in the prior art.

The present embodiment is thus based on the association of a mathematical formula that describes the laden radius involving the transverse thrust force with the TameTire model for predicting this force as a function of the input quantities of a simulation tool such as load, cornering, camber, speed, pressure, temperatures.

The formulation presented in this embodiment makes it possible to find a relatively simple expression, by way of a mathematical model, for the laden radius value of a tire as a function of relevant quantities that are easily measurable on a mechanical test machine, via a set of coefficients that can be found by way of rapid optimization.

The use of such a formulation is then based on the knowledge of the quantities involved, which are, in a simulation tool, either input quantities such as load, speed, pressure, camber, or quantities that are dependent on the tire such as the transverse load. These intermediate quantities should be able to be deduced from the input quantities in order to realize a simulation. Since the transverse load depends on numerous phenomena, including the internal temperature and the surface temperature of the tire, the choice has been made to replace the direct measurement of the transverse load, which is not generally available at the inputs of a simulation model, with a value of this transverse load obtained via the TameTire model.

An expression of the laden radius which also incorporates the effects of the internal temperature and the surface temperature is thus found, this expression being usable directly in a simulation tool. The TameTire model becomes more precise in the retrieval of geometric data but also torsor data since these are also dependent on the laden radius.

The results show greater acuity of the model proposed here compared with known models. The centrifugal effect associated with speed is not taken into account in the formulation MF-5.2. This effect is rendered well overall by TameTire. Similarly, the results show that the transverse load effect is taken into account well with TameTire. The camber angle effects are rendered better with TameTire than with MF-5.2.

The combination of a relevant formula of the laden radius in a descriptive model of the torsor such as TameTire makes it possible to take into account effects that are associated one with the other and vice versa. The TameTire model thus becomes more precise in terms of the loads/forces but especially in terms of the torques generated, while the laden radius model incorporates the advantages of the TameTire model in order to calculate the transverse load, in particular taking better account of the thermal effects, greater calculating speed and greater relevance associated with the physical bases of this model.

The whole can be implemented within software for simulating the dynamics of vehicles in order to carry out more realistic manoeuvres, in particular in situations at the overturning limits of the vehicle, such as safety manoeuvres of the type of the elk test, evasive manoeuvres, etc. The preselection of components of the vehicle such as connections to the ground, tires, or the adjustment thereof, for example by way of connections to the ground or by way of the ESP (Electronic Stability Program), can then be carried out more effectively. One of the additional advantages consists in better prediction of the risks of contacts between the rim and the roadway, this being essential for the problems of evasion and/or overturning tests. Overall, the interactions of the laden radius with the other parameters of the TameTire torsor or of the torsor with the laden radius are taken into account. A model of the torsor and of a part of the geometry of the tire is thus created by way of the laden radius, these affording greater acquisition speed and greater relevance of the simulated quantities.

The invention claimed is:

1. A method for determining a behaviour of a tire to be produced for a motor vehicle, the method comprising steps of:
(i) implementing within a software program of a simulation computer-processing tool a formula for estimating a laden radius $R_l$ of the tire, the formula having a form of:

$$R_l = R_0 - \frac{Fz}{Kzz} + R_V \times V^2 - \left(\frac{R_{Y1}}{Pg} + R_{Y2}\right) \times |Fy| + R_\gamma \times |\gamma|,$$

where:
$K_{ZZ}$ has a form of: $K_{ZZ} = K_{ZZ\,0} + K_{ZZp} \times Pg$,
$K_{ZZ0}$ and $K_{ZZp}$ are numerical values,
Pg is an inflation pressure of the tire,
V is a speed of the vehicle,
$F_Z$ is a load applied to the tire,
$F_Y$ is a transverse thrust force exerted on the tire,
$\gamma$ is a camber angle of the vehicle,
$R_0$ is a free radius value of the tire at rest,
$R_V$ is a coefficient of influence of the speed of the vehicle on the laden radius,
$R_{Y1}$ is a coefficient of influence of an inflation pressure on the laden radius via a value of a transverse load,
$R_{Y2}$ is a coefficient of influence of the transverse load on the laden radius without the part of the transverse load associated with the inflation pressure, and
$R_\gamma$ is a coefficient of influence of a camber angle value of the vehicle on the laden radius;
(ii) determining values for Pg, V, $F_Z$, $F_Y$, $\gamma$, $R_0$, $R_V$, $R_{Y1}$, $R_{Y2}$, and $R_\gamma$ to be used in the formula for estimating the laden radius $R_l$;
(iii) estimating the laden radius $R_l$ of the tire by executing the software program in the simulation computer-processing tool using the values determined in the step (ii);
(iv) determining a predicted behaviour of the tire based on the laden radius $R_l$ of the tire estimated in the step (iii); and
(v) utilizing the predicted behaviour determined in the step (iv) to produce a tire having a predictable rolling behaviour.

2. The method according to claim 1, wherein, in the step (ii), the values for the coefficients $R_0$, $R_V$, $R_{Y1}$, $R_{Y2}$, and $R_\gamma$ are determined by physical tests on a tire representative of the tire to be produced.

3. The method according to claim 2, wherein the physical tests are carried out using a roller of a flat ground type.

4. The method according to claim 1, further comprising a step of, before the step (iv), using the software program to simulate force dynamics at a wheel center.

5. The method according to claim 4, wherein the values for the coefficients $R_0$, $R_V$, $R_{Y1}$, $R_{Y2}$, and $R_\gamma$ are used in the software program to simulate the force dynamics at the wheel center.

6. The method according to claim 1, wherein, in the step (ii), the value for the transverse thrust force ($F_Y$) is determined by inputting into the simulation computer-processing tool a plurality of physical parameters that are indicative of physical stresses to which the tire to be produced would be subjected.

7. The method according to claim 6, wherein the value for the transverse thrust force ($F_y$) is determined by taking into account an internal temperature and a surface temperature of the tire to be produced.

8. The method according to claim 6, further comprising a step of, before the step (iv), using the software program to simulate force dynamics at a wheel center, wherein the simulation computer-processing tool is a processor that executes the software program to simulate the force dynamics at the wheel center.

9. The method according to claim 7, further comprising a step of, before the step (iv), using the software program to simulate force dynamics at a wheel center, wherein the simulation computer-processing tool is a processor that executes the software program to simulate the force dynamics at the wheel center.

10. A processor for determining a behaviour of a tire to be produced for a motor vehicle, the processor comprising:
(i) programmed instructions for a formula for estimating a laden radius $R_l$ of the tire by using a formula having a form of:

$$R_l = R_0 - \frac{Fz}{K_{ZZ}} + R_V \times V^2 - \left(\frac{R_{Y1}}{Pg} + R_{Y2}\right) \times |Fy| + R_\gamma \times |\gamma|,$$

where:
$K_{ZZ}$ has a form of: $K_{ZZ}=K_{ZZ\,0}+K_{ZZp}\times Pg$,
$K_{ZZ0}$ and $K_{ZZp}$ are numerical values,
Pg is an inflation pressure of the tire,
V is a speed of the vehicle,
$F_Z$ is a load applied to the tire,
$F_Y$ is a transverse thrust force exerted on the tire,
γ is a camber angle of the vehicle,
$R_0$ is a free radius value of the tire at rest,
$R_V$ is a coefficient of influence of the speed of the vehicle on the laden radius,
$R_{Y1}$ is a coefficient of influence of an inflation pressure on the laden radius via a value of a transverse load,
$R_{Y2}$ is a coefficient of influence of the transverse load on the laden radius without the part of the transverse load associated with the inflation pressure, and
$R_\gamma$ is a coefficient of influence of a camber angle value of the vehicle on the laden radius;
(ii) programmed instructions for estimating the laden radius $R_l$ of the tire by executing the programmed instructions of (i) using calculated or inputted values for Pg, V, $F_Z$, $F_Y$, γ, $R_0$, $R_V$, $R_{Y1}$, $R_{Y2}$, and $R_\gamma$; and (iii) programmed instructions for determining a predicted behaviour of the tire based on the laden radius $R_l$ of the tire estimated using the programmed instructions of (ii),
wherein the predicted behaviour determined using the programmed instructions of (iii) is used to produce a tire having a predictable rolling behaviour.

11. A tire for a motor vehicle, the tire being produced according to a design that takes into account results of a simulation method for determining a behaviour of the tire, the method comprising:
(i) implementing within a software program of a simulation computer-processing tool a formula for estimating a laden radius $R_l$ of the tire, the formula having a form of:

$$R_l = R_0 - \frac{Fz}{K_{ZZ}} + R_V \times V^2 - \left(\frac{R_{Y1}}{Pg} + R_{Y2}\right) \times |Fy| + R_\gamma \times |\gamma|,$$

where:
$K_{ZZ}$ has a form of: $K_{ZZ}=K_{ZZ\,0}+K_{ZZp}\times Pg$,
$K_{ZZ0}$ and $K_{ZZp}$ are numerical values,
Pg is an inflation pressure of the tire,
V is a speed of the vehicle,
$F_Z$ is a load applied to the tire,
$F_Y$ is a transverse thrust force exerted on the tire,
γ is a camber angle of the vehicle,
$R_0$ is a free radius value of the tire at rest,
$R_V$ is a coefficient of influence of the speed of the vehicle on the laden radius,
$R_{Y1}$ is a coefficient of influence of an inflation pressure on the laden radius via a value of a transverse load,
$R_{Y2}$ is a coefficient of influence of the transverse load on the laden radius without the part of the transverse load associated with the inflation pressure, and
$R_\gamma$ is a coefficient of influence of a camber angle value of the vehicle on the laden radius;
(ii) determining values for Pg, V, $F_Z$, $F_Y$, γ, $R_0$, $R_V$, $R_{Y1}$, $R_{Y2}$, and $R_\gamma$ to be used in the formula for estimating the laden radius $R_l$;
(iii) estimating the laden radius $R_l$ of the tire by executing the software program using the values determined in the step (ii);
(iv) determining a predicted behaviour of the tire based on the laden radius $R_l$ of the tire estimated in the step (iii); and
(v) utilizing the predicted behaviour determined in the step (iv) in the design so that the tire has a predictable rolling behaviour.

* * * * *

UNITED STATES PATENT AND TRADEMARK OFFICE
CERTIFICATE OF CORRECTION

PATENT NO. : 10,093,141 B2
APPLICATION NO. : 14/909525
DATED : October 9, 2018
INVENTOR(S) : Jérémy Buisson et al.

Page 1 of 1

It is certified that error appears in the above-identified patent and that said Letters Patent is hereby corrected as shown below:

In the Specification

Column 2:
Line 1, "Pg" should read --P$_g$,--.

Column 3:
Line 34, "(Nm$^-$)" should read --(Nm$^{-1}$)--.

Column 8:
Line 31, "R$_{y1}$" should read --R$_{Y1}$--.

Signed and Sealed this
Sixteenth Day of July, 2019

Andrei Iancu
*Director of the United States Patent and Trademark Office*